United States Patent
Kim

(10) Patent No.: US 8,362,483 B2
(45) Date of Patent: Jan. 29, 2013

(54) THIN FILM TRANSISTOR SUBSTRATE AND FLAT PANEL DISPLAY COMPRISING THE SAME

(75) Inventor: Bunggoo Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 129 days.

(21) Appl. No.: 12/081,225

(22) Filed: Apr. 11, 2008

(65) Prior Publication Data

US 2008/0251787 A1    Oct. 16, 2008

(30) Foreign Application Priority Data

Apr. 13, 2007 (KR) .................. 10-2007-0036269

(51) Int. Cl.
*H01L 31/00* (2006.01)
*H01L 29/10* (2006.01)

(52) U.S. Cl. ....... 257/59; 257/48; 257/72; 257/E21.524; 345/68; 345/205; 345/204; 345/214

(58) Field of Classification Search .................. 257/59, 257/203, 48, 780, 781, E29.327, E29.273, 257/E51.005, E29.151, 72, E21.524; 438/158; 349/12, 37, 38, 48, 40, 139–152, 54, 49, 349/41, 46; 345/100, 98, 95, 87, 68, 204, 345/205, 214; 324/770
See application file for complete search history.

(56) References Cited

U.S. PATENT DOCUMENTS

| | | | | |
|---|---|---|---|---|
| 5,754,158 A * | 5/1998 | Misawa et al. | ................. | 345/100 |
| 5,949,397 A * | 9/1999 | Koyama et al. | ................ | 345/100 |
| 6,590,624 B1 * | 7/2003 | Lee | .................................. | 349/54 |
| 6,734,925 B1 * | 5/2004 | Lee et al. | ......................... | 349/40 |
| 6,937,314 B2 * | 8/2005 | Kim | ................................ | 349/149 |
| 6,956,396 B2 * | 10/2005 | Lai et al. | ................... | 324/760.02 |
| 6,995,474 B1 * | 2/2006 | Ho et al. | ......................... | 257/781 |
| 2001/0040565 A1 * | 11/2001 | Koyama | ......................... | 345/204 |
| 2003/0117536 A1 * | 6/2003 | Jeon | ................. | 349/40 |
| 2006/0007085 A1 * | 1/2006 | Kim et al. | ....................... | 345/87 |
| 2006/0033857 A1 * | 2/2006 | Kim et al. | ........................ | 349/54 |
| 2006/0146247 A1 * | 7/2006 | Kim | ................. | 349/141 |
| 2007/0001711 A1 * | 1/2007 | Kwak | ............. | 324/770 |
| 2007/0018680 A1 * | 1/2007 | Jeon et al. | ..................... | 324/770 |
| 2007/0046581 A1 * | 3/2007 | Kwak et al. | ..................... | 345/68 |
| 2008/0017855 A1 * | 1/2008 | Kim et al. | ....................... | 257/48 |
| 2008/0100556 A1 * | 5/2008 | Tseng | ............................. | 345/95 |

* cited by examiner

*Primary Examiner* — Colleen Matthews
*Assistant Examiner* — Galina Yushina
(74) *Attorney, Agent, or Firm* — McKenna, Long and Aldridge, LLP.

(57) ABSTRACT

A thin film transistor (TFT) substrate includes a TFT that including a gate electrode, a source electrode, and a drain electrode formed on an insulating substrate divided into a display area and a non-display area to provide test driving signals provided from the outside to the display area, a test signal line connected to the drain electrode of the TFT, a pad unit signal line insulated from the test signal line by an insulating layer and connected to signal lines formed in the display area, and a jumping pad electrode electrically connecting the test signal line and the pad unit signal line to each other through a contact hole that penetrates the insulating layer, connected to a driving circuit for driving the display area, and providing driving signals provided from the driving circuit to the pad unit signal line and a flat panel display (FPD) including the same.

20 Claims, 16 Drawing Sheets

THIN FILM TRANSISTOR SUBSTRATE AND FLAT PANEL DISPLAY COMPRISING THE SAME

This application claims the benefit of Korean Patent Application No. 10-2007-0036269, filed on Apr. 13, 2007, which is hereby incorporated by reference for all purposes as if fully set forth herein.

BACKGROUND OF THE INVENTION

1. Field of the Invention

The present invention relates to displays in general and in particular to a thin film transistor (TFT) substrate and a flat panel display including the same.

2. Discussion of the Related Art

A flat panel display (FPD) such as a liquid crystal display (LCD) and an organic light emitting diode (OLED) can include a thin film transistor (TFT) substrate on which a thin film transistor (TFT) that is a switching element is formed for active matrix (AM) driving.

The TFT substrate can be divided into a display area and a non-display area that surrounds the display area. A driving circuit that drives the FPD can be mounted on a driving circuit mounting area provided in the non-display area.

The driving circuit can be mounted on the driving circuit mounting area through one of a wire bonding (WB) method, a tape automated bonding (TAB) method, and a chip on glass (COG) method.

In the COG mounting method, the driving circuit including an input bump and an output bump is directly mounted on the TFT substrate. When the driving circuit is mounted on the TFT substrate through the COG method, the input bump and the output bump of the driving circuit can be connected to an input pad electrode and an output pad electrode formed on the TFT substrate. Here, the output pad electrode can be electrically connected to signal lines for driving the display area of the TFT substrate, for example, gate lines and data lines.

Since the input pad electrode and the output pad electrode are separated from each other by the distance between the input bump and the output bump of the driving circuit, an area between the input pad electrode and the output pad electrode can be formed in the driving circuit mounting area.

Recently, in order to improve the usability of the TFT substrate, a technology of forming test patterns for lighting test in the lighting test pattern area has been developed in which a lighting test pattern area is provided in an area between the input pad electrode and the output pad electrode.

However, when the distance between the input bump and the output bump is reduced as the driving circuit is made small, the reduced distance between the input pad electrode and the output pad electrode also reduces the size of the lighting test pattern area.

Therefore, it is very difficult to form the test patterns in the lighting test pattern area whose size is reduced.

SUMMARY OF THE INVENTION

Accordingly, the present invention is directed to a thin film transistor substrate and flat panel display including the same that substantially obviates one or more of the problems due to limitations and disadvantages of the related art.

An advantage of the present invention is to provide a thin film transistor (TFT) substrate that can correspond to the miniaturization of a driving circuit and a flat panel display (FPD) including the same. In addition, another aspect of this document is to provide a TFT substrate that can increase the size of a lighting test pattern area provided in a driving circuit mounting area and a FPD including the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings A TFT substrate according to the present invention comprises a TFT comprising a gate electrode, a source electrode, and a drain electrode formed on an insulating substrate divided into a display area and a non-display area to provide test driving signals provided from the outside to the display area, a test signal line connected to the drain electrode of the TFT, a pad unit signal line insulated from the test signal line by an insulating layer and connected to signal lines formed in the display area, and a jumping pad electrode electrically connecting the test signal line and the pad unit signal line to each other through a contact hole that penetrates the insulating layer, connected to a driving circuit for driving the display area, and providing driving signals provided from the driving circuit to the pad unit signal line.

A TFT substrate according to the present invention comprises a gate line and a data line that are insulated from each other and that cross each other in a display area on an insulating substrate divided into the display area and a non-display area, a pad unit signal line connected to one of the gate line and the data line, a first TFT providing a test driving signal provided from the outside to the display area, a test signal line insulated from the pad unit signal line by an insulating layer and connected to the first TFT, and a jumping pad electrode electrically connecting the pad unit signal line and the test signal line to each other through a first contact hole that penetrates the insulating layer, connected to a driving circuit for driving the display area, and providing driving signals provided from the driving circuit to the pad unit signal line.

A FPD according to the present invention comprises a FPD panel comprising a TFT substrate divided into a display area and a non-display area to display an image through the display area and a driving circuit mounted on the TFT substrate of the FPD panel to provide driving signals for driving the FPD panel to the TFT substrate. The TFT substrate of the FPD panel comprises a TFT comprising a gate electrode, a source electrode, and a drain electrode formed on an insulating substrate to provide test driving signals provided from the outside to the display area, a test signal line connected to the drain electrode of the TFT, a pad unit signal line insulated from the test signal line by an insulating layer and connected to signal lines formed in the display area, and a jumping pad electrode electrically connecting the test signal line and the pad unit signal line to each other through a contact hole that penetrates the insulating layer, connected to a driving circuit, and providing driving signals provided from the driving circuit to the pad unit signal line.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail embodiments of the invention examples of which are illustrated in the accompanying drawings.

That a certain component is formed of gate metal in the specification means that the component is formed on an insulating substrate of a Cr or Cr alloy, an Al or Al alloy, a Mo or Mo alloy, an Ag or Ag alloy, a Cu or Cu alloy, a Ti or Ti alloy, and a Ta or Ta alloy to have a structure laminated by at least one layer. Components formed of the gate metal can be formed of the same material on the same plane. For example, when the gate lines and the gate electrode are formed of the gate metal, the gate lines and the gate electrode can be formed of the same material on the same plane.

In addition, that the other components are formed of data metal in the specification means that the components are formed on an insulating substrate of a Cr or Cr alloy, an Al or Al alloy, a Mo or Mo alloy, an Ag or Ag alloy, a Cu or Cu alloy, a Ti or Ti alloy, and a Ta or Ta alloy to have a structure laminated by at least one layer. The components formed of the data metal can be formed of the same material on the same plane. For example, when data lines and a source electrode and a drain electrode are formed of the data metal, the data lines and the source electrode and the drain electrode can be formed of the same material on the same plane. Here, the components formed of the data metal and the components formed of the gate metal can be insulated by at least one insulating layer.

That the other components are formed of transparent conductive metal in the specification can mean that the components are formed on the insulating substrate of indium tin oxide (ITO) or indium zinc oxide (IZO). At this time, the components formed of the transparent conductive metal can be formed of the same material on the same plane. For example, when a pixel electrode and a test pad electrode are formed of the transparent conductive metal, the pixel electrode and the test pad electrode can be formed of the same material on the same plane.

Components comprising an item of jumping in the specification can electrically connect signal lines insulated from each other through contact holes that penetrate a gate insulating layer and/or a protective layer. For example, when a test signal line and a pad unit signal line are insulated from each other by the gate insulating layer, a jumping pad electrode can electrically connect the test signal line and the pad unit signal line to each other through the contact holes that penetrate the gate insulating layer or the protecting layer.

Figure 1:
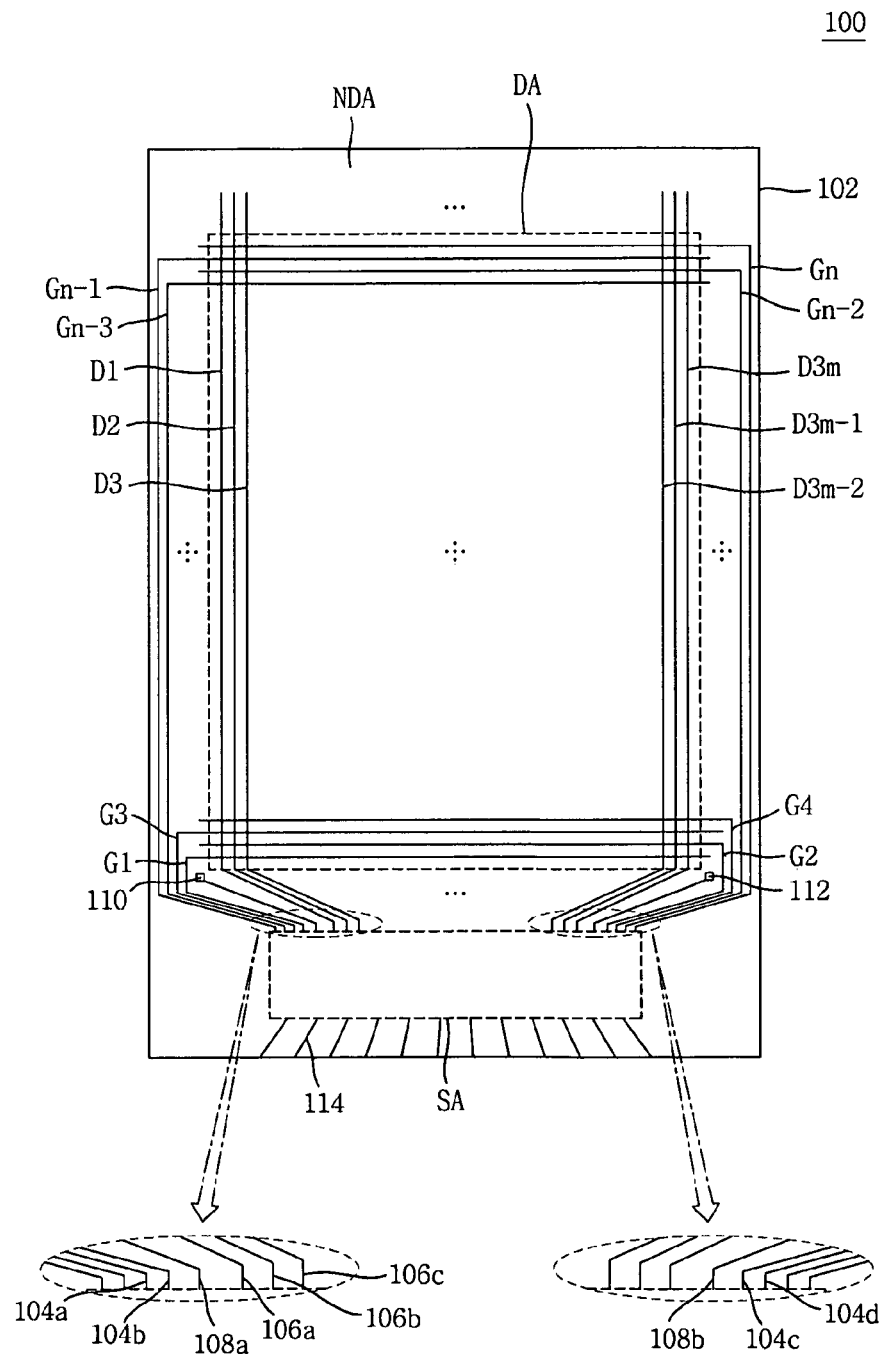
FIG. 1 is a plan view schematically illustrating the arrangement structure of a thin film transistor (TFT) substrate according to an embodiment of the present invention.

Referring to FIG. 1, a thin film transistor (TFT) substrate 100 according to an embodiment of the present invention can be included in a flat panel display (FPD) such as a liquid crystal display (LCD) and an organic light emitting diode (OLED). For example, when the TFT substrate 100 is included in the LCD, the TFT substrate 100 can provide driving signals to the liquid crystal layer of the LCD. An insulating substrate 102 formed of a material such as glass and plastic can be used as the base of the TFT substrate 100.

The insulating substrate 102 can be divided into a display area DA and a non-display area NDA that surrounds the display area. At this time, a driving circuit mounting area SA for mounting a driving circuit for driving the FPD can be provided in the non-display area NDA in the lower end of the insulating substrate 102 in the non-display area NDA. Here, the driving circuit can include the input bump and the output bump.

Gate lines G1, G2, G3, G4, ..., Gn-3, Gn-2, Gn-1, and Gn that cross and are insulated from data lines D1, D2, D3, ..., D3m-2, D3m-1, and D3m are formed in the display area DA on the insulating substrate 102. Here, the pixel area can include red/green/blue pixel areas, the red/green/blue pixel areas are horizontally and alternately formed, and can be vertically formed in a row.

One side of each of the gate lines G1, G2, G3, G4, ..., Gn-3, Gn-2, Gn-1, and Gn can be extended to the non-display area NDA on the insulating substrate 102. In the illustrated embodiment, one side of each of the odd gate lines G1, G3, ..., Gn-3, and Gn-1 among the gate lines G1, G2, G3, G4, ..., Gn-3, Gn-2, Gn-1, and Gn is extended to the left of the lower end of the non-display area NDA and one side of each of the even gate lines G2, G4, ..., Gn-2, and Gn among the gate lines G1, G2, G3, G4, ..., Gn-3, Gn-2, Gn-1, and Gn can be extended to the right of the lower end of the non-display area NDA.

One side of each of the data lines D1, D2, D3, ..., D3m-2, D3m-1, and D3m can be extended to the non-display area NDA on the insulating substrate 102. In the illustrated embodiment, one side of each of the data lines D1, D2, D3, ..., D3m-2, D3m-1, and D3m can be extended between one side of each of the odd gate lines G1, G3, ..., Gn-3, and Gn-1 and one side of each of the even gate lines G2, G4, ..., Gn-2, and Gn, that is, to the center of the lower end of the non-display area NDA.

A gate pad unit signal line 104, a data pad unit signal line 106, a common pad unit signal line 108, and an external connection signal line 114 are formed in the non-display area NDA on the insulating substrate 102.

The gate pad unit signal line 104 can include first and second gate pad unit signal lines 104a and 104b formed on the left of the lower end of the non-display area NDA and third and fourth gate pad unit signal lines 104c and 104d formed on the right of the lower end of the non-display area NDA.

One side of the first gate pad unit signal line 104a can be connected to one side of each of the even gate lines G3, . . . , and Gn-1 among the odd gate lines G1, G3, . . . , Gn-3, and Gn-1, that is, among the gate lines G1, G3, . . . , and Gn-3, and Gn-1 one side of each of which is extended to the left of the lower end of the non-display area NDA and the other side can be extended to the driving circuit mounting area SA.

One side of the second gate pad unit signal line 104b can be connected to one side of each of the odd gate lines G1, . . . , and Gn-3 among the odd gate lines G1, G3, . . . , and Gn-3, and Gn-1, that is, among the gate lines G1, G3, . . . , and Gn-3, and Gn-1 one side of each of which is extended to the left of the lower end of the non-display area NDA and the other side can be extended to the driving circuit mounting area SA.

One side of the third gate pad unit signal line 104c can be connected to one side of each of the odd gate lines G2, . . . , Gn-2 among the even gate lines G2, G4, . . . , Gn-2, and Gn, that is, among the gate lines G2, G4, . . . , Gn-2, and Gn one side of each of which is extended to the right of the lower end of the non-display area NDA and the other side can be extended to the driving circuit mounting area SA.

One side of the fourth gate pad unit signal line 104d can be connected to one side of each of the even gate lines G4, . . . , and Gn among the even gate lines G2, G4, . . . , Gn-2, and Gn, that is, among the gate lines G2, G4, . . . , Gn-2, and Gn one side of each of which is extended to the right of the lower end of the non-display area NDA and the other side can be extended to the driving circuit mounting area SA.

The data pad unit signal line 106 can include first to third data pad unit signal lines 106a, 106b, and 106c.

The first to third data pad unit signal lines 106a, 106b, and 106c can be substantially parallel to each other and alternately formed. In the illustrated embodiment, one side of each of the first to third data pad unit signal lines 106a, 106b, and 106c can be connected to one side of each of the corresponding data lines D1, D2, D3, . . . , D3m-2, D3m-1, and D3m and the other sides of the first to third data pad unit signal lines 106a, 106b, and 106c can be extended to the driving circuit mounting area SA.

The common pad unit signal line 108 can include a first common pad unit signal line 108a formed on the left of the lower end of the non-display area NDA and a second common pad unit signal line 108b formed on the right of the lower end of the non-display area NDA.

One side of each of the first and second common pad unit signal lines 108a and 108b can be connected to each of first and second common terminals 110 and 112 and the other sides of the first and second common pad unit signal lines 108a and 108b can be extended to the driving circuit mounting area SA.

The external connection signal line 114 can be formed under the driving circuit mounting area SA. At this time, one side of the external connection signal line 114 can be connected to a flexible printed circuit (FPC). On the other hand, the other side of the external connection signal line 114 is extended to the driving circuit mounting area SA and the input bump of the driving circuit can be connected to a connected input pad electrode.

Figure 2:
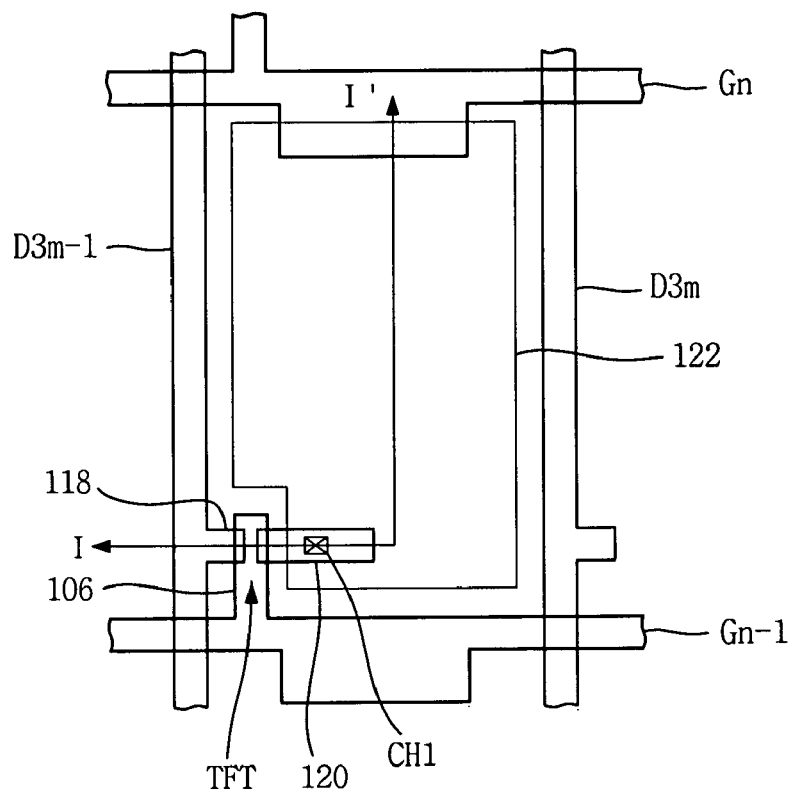
FIG. 2 is a plan view illustrating the display area of FIG. 1 in detail.
Figure 3:
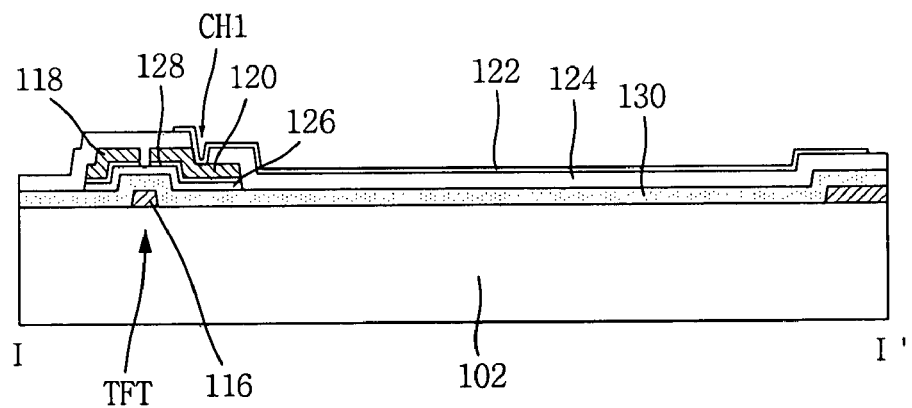
FIG. 3 is a sectional view taken along the line I-I' of FIG. 2.

FIGS. 2 and 3, for the purposes of describing a display area, illustrate an example pixel area provided by crossings between the (n-1)th gate line and the nth gate line and between the (3m-1)th data line and the 3mth data line.

Referring to FIGS. 2 and 3, on the display area DA on the insulating substrate 102, as described above, the gate lines Gn-1 and Gn and data lines D3m-1 and D3m that are insulated from each other and that cross each other to define the pixel areas are formed. In addition, in the display area DA on the insulating substrate 102, a thin film transistor (TFT) and a pixel electrode 122 are further formed. Here, the gate lines Gn-1 and Gn and the data lines D3m-1 and D3m can be formed of the gate metal and the data metal, respectively.

The TFT is formed at the crossing between the corresponding gate line Gn-1 and the corresponding data line D3m-1 to be connected to the data line Gn-1 and the data line D3m-1 and can be used as a switching element for driving an active matrix. Therefore, the TFT can include a gate electrode 116, a source electrode 118, and a drain electrode 120. Here, the gate electrode 116 can be formed of the gate metal. In addition, the source electrode 118 and the drain electrode 120 can be formed of the data metal.

The pixel electrode 122 can be connected to the drain electrode 120 through a first contact hole CH1 that penetrates a protective layer 124. Here, the pixel electrode 122 can be formed of transparent conductive metal.

Figure 4:
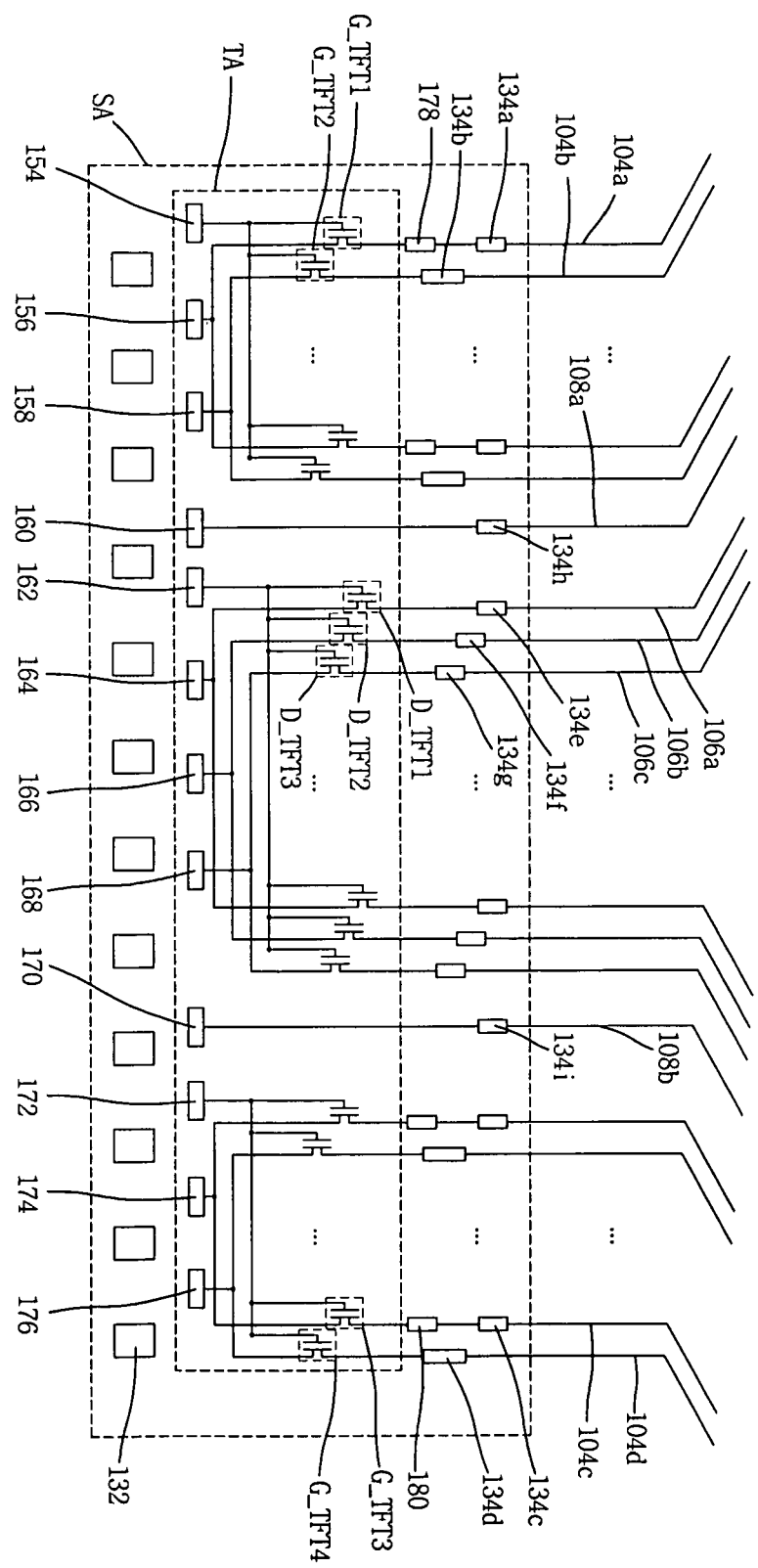
FIG. 4 is a plan view schematically illustrating a first embodiment of the arrangement structure of the driving circuit mounting area of FIG. 1.

Reference numerals 126, 128, and 130 denote an active layer, an ohmic contact layer, and a gate insulating layer, respectively Referring to FIG. 4, in the non-display area NDA on the insulating substrate 102, as described above, the driving circuit mounting area SA for mounting the driving circuit including the input bump and the output bump can be provided.

The input bump and the output bump of the driving circuit mounted on the driving circuit mounting area SA can be connected to an input pad electrode 132 and an output pad electrode 134 formed in the driving circuit mounting area SA.

The input pad electrode 132 can be formed in the lower end in the driving circuit mounting area SA and can be connected to the external connection signal line 114. Here, the input pad electrode 132 can be formed of the transparent conductive metal.

The output pad electrode 134 can be formed in the upper end in the driving circuit mounting area SA and can be connected to the pad unit signal lines 104, 106, and 108. Here, the output pad electrode 134 can be formed of the transparent conductive metal.

The output pad electrode 134 can include a first gate pad electrode 134a, a first gate jumping pad electrode 134b, a second gate pad electrode 134c, a second gate jumping pad electrode 134d, first to third data pad electrodes 134e, 134f, and 134g, and first and second common pad electrodes 134h and 134i.

The first gate pad electrode 134a can be connected to the first gate pad unit signal line 104a. The first gate jumping pad electrode 134b can be connected to the second gate pad unit signal line 104b. The second gate pad electrode 134c can be connected to the third gate pad unit signal line 104c. The second gate jumping pad electrode 134d can be connected to the fourth gate pad unit signal line 104d.

The first to third data pad electrodes 134e, 134f, and 134g can be connected to the first to third data pad unit signal lines 106a, 106b, and 106c. The first and second common pad electrodes 134h and 134i can be connected to the first and second common pad unit signal lines 108a and 108b.

In the above-described driving circuit mounting area SA, in detail, between the input pad electrode 132 and the output pad electrode 134, a lighting test pattern area TA in which test patterns for lighting test are formed can be provided.

A gate TFT G_TFT, a data TFT D_TFT, and first to 12th test pad electrodes 154, 156, 158, 160, 162, 164, 166, 168, 170, 172, 174, and 176 can be formed in the lighting test pattern area TA. Here, the first to 12th test pad electrodes 154, 156, 158, 160, 162, 164, 166, 168, 170, 172, 174, and 176 can be formed of the transparent conductive metal.

The gate TFT G_TFT can provide test gate driving signals provided from the outside to the corresponding gate lines G1, G2, G3, G4, ..., Gn-3, Gn-2, Gn-1, and Gn in the lighting test. The gate TFT G_TFT can include first to fourth gate TFTs G_TFT1, G_TFT2, G_TFT3, and G_TFT4.

Each of the first to fourth gate TFTs G_TFT1, G_TFT2, G_TFT3, and G_TFT4 can include a gate electrode, a source electrode, and a drain electrode. Here, the gate electrode can be formed of the gate metal and the source electrode and the drain electrode can be formed of the data metal.

The gate electrode of the first gate TFT G_TFT1 can be connected to the first test pad electrode 154. The source electrode of the first gate TFT G_TFT1 can be connected to the second test pad electrode 156. The drain electrode of the first gate TFT G_TFT1 can be connected to a first jumping unit 178. Here, the first jumping unit 178 can be connected to the first gate pad electrode 134*a*.

The gate electrode of the second gate TFT G_TFT2 can be connected to the first test pad electrode 154. The source electrode of the second gate TFT G_TFT2 can be connected to the third test pad electrode 158. The drain electrode of the second gate TFT G_TFT2 can be connected to the first gate jumping pad electrode 134*b*.

The gate electrode of the third gate TFT G_TFT3 can be connected to the 10th test pad electrode 172. The source electrode of the third gate TFT G_TFT3 can be connected to the 11th test pad electrode 174. The drain electrode of the third gate TFT G_TFT3 can be connected to a second jumping unit 180. Here, the second jumping unit 180 can be connected to the second gate pad electrode 134*c*.

The gate electrode of the fourth gate TFT G_TFT4 can be connected to the 10th test pad electrode 172. The source electrode of the fourth gate TFT G_TFT4 can be connected to the 12th test pad electrode 176. The drain electrode of the fourth gate TFT G_TFT4 can be connected to the second gate jumping pad electrode 134*d*.

A data TFT D_TFT can provide test data driving signals provided from the outside to the corresponding data lines D1, D2, D3, ..., D3*m*-2, D3*m*-1, and D3*m* in the lighting test. The data TFT D_TFT can include first to third data TFTs D_TFT1, D_TFT2, and D_TFT3.

Each of the first to third data TFTs D_TFT1, D_TFT2, and D_TFT3 can include a gate electrode, a source electrode, and a drain electrode. Here, the gate electrode can be formed of the gate metal and the source electrode and the drain electrode can be formed of the data metal.

The gate electrode of the first data TFT D_TFT1 can be connected to the fifth test pad electrode 162. The source electrode of the first data TFT D_TFT1 can be connected to the sixth test pad electrode 164. The drain electrode of the first data TFT D_TFT1 can be connected to the first data pad electrode 134*e*. The gate electrode of the second data TFT D_TFT2 can be connected to the fifth test pad electrode 162. The source electrode of the second data TFT D_TFT2 can be connected to the seventh test pad electrode 166. The drain electrode of the second data TFT D_TFT2 can be connected to the second data pad electrode 134*f*.

The gate electrode of the third data TFT D_TFT3 can be connected to the fifth test pad electrode 162. The source electrode of the third data TFT D_TFT3 can be connected to the eighth test pad electrode 168. The drain electrode of the third data TFT D_TFT3 can be connected to the data pad electrode 134*g*.

The first and second common pad electrodes 134*h* and 134*i* can be connected to the fourth and ninth test pad electrodes 160 and 170.

Figure 5:
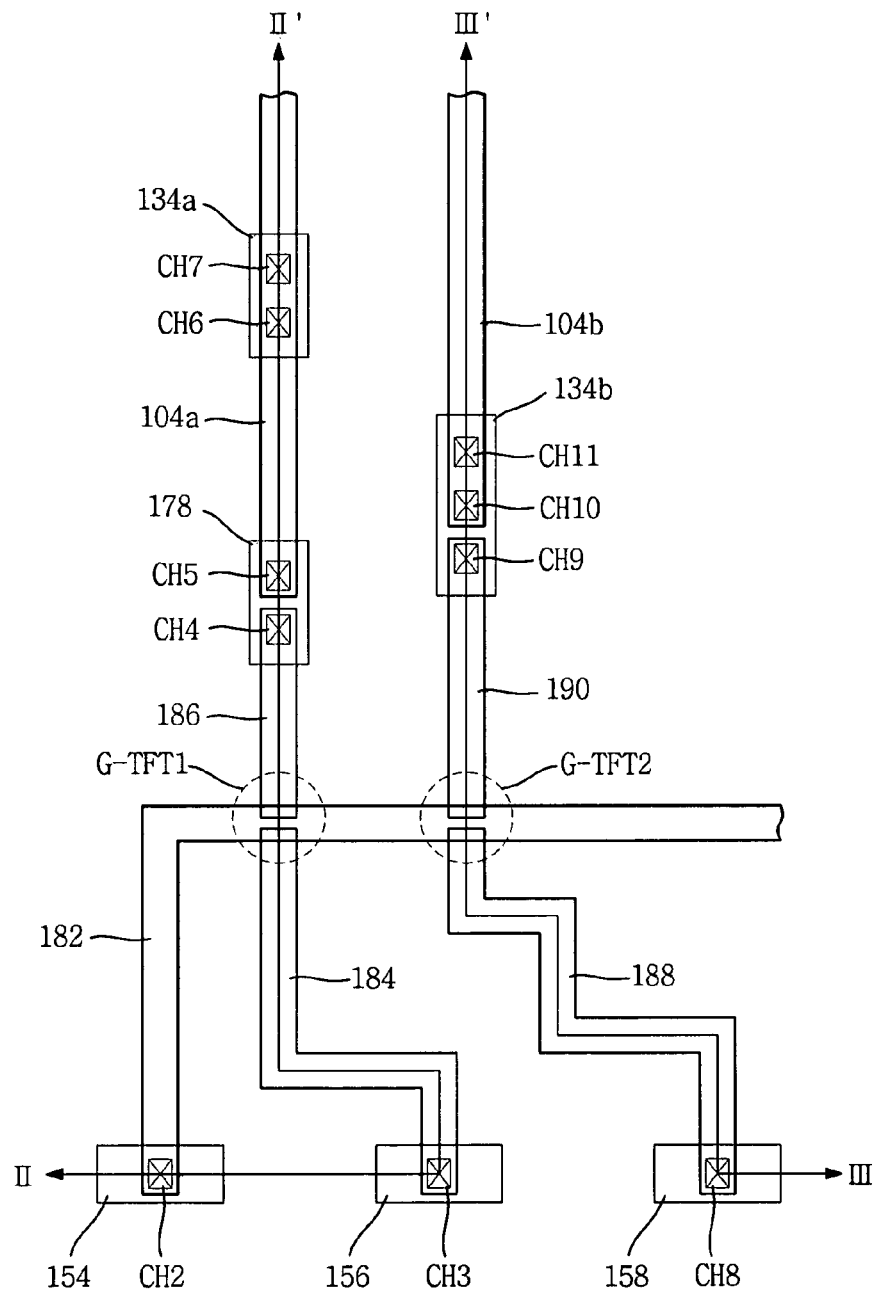
FIG. 5 is a plan view illustrating the connection structures of the gate pad unit signal lines of FIG. 4 in detail.

On the other hand, FIG. 5 illustrates the connection structures of the first and second gate pad unit signal lines formed on the left of the lower end of the non-display area NDA among the gate pad unit signal lines. However, the connection structures are not limited to the above. On the other hand, since the connection structures of the third and fourth gate pad unit signal lines formed on the right of the lower end of the non-display area among the gate pad unit signal lines are the same as the connection structures of the first and second gate pad unit signal lines illustrated in FIG. 5, detailed description thereof will be omitted.

Referring to FIG. 5, in the gate pad unit on the left of the lower end of the non-display area NDA, as described above, the first and second gate TFTs G_TFT1 and G_TFT2, the first to third test pad electrodes 154, 156, and 158, the first jumping unit 178, the first gate pad electrode 134*a*, the first gate jumping pad electrode 134*b*, and the first and second gate pad signal lines 104*a* and 104*b* are formed. In addition, in the gate pad unit on the left of the lower end of the non-display area NDA, first to fifth test signal lines 182, 184, 186, 188, and 190 are further formed. Here, the first to third test pad electrodes 154, 156, and 158, the first jumping unit 178, the first gate pad electrode 134*a*, and the first gate jumping pad electrode 134*b* can be formed of the transparent conductive metal. In addition, the first and second gate pad signal lines 104*a* and 104*b* can be formed of the gate metal. In addition, the first test signal line 182 can be formed of the gate metal. In addition, the second to fifth test signal lines 184, 186, 188, and 190 can be formed of the data metal.

The first test signal line 182 can be connected to the gate electrodes of the first and second gate TFTs G_TFT1 and G_TFT2. The second test signal line 184 can be connected to the source electrode of the first gate TFT G_TFT1. The third test signal line 186 can be connected to the drain electrode of the first gate TFT G_TFT1. The fourth test signal line 188 can be connected to the source electrode of the second gate TFT G_TFT2. The fifth test signal line 190 can be connected to the drain electrode of the second gate TFT G_TFT2.

Figure 6:
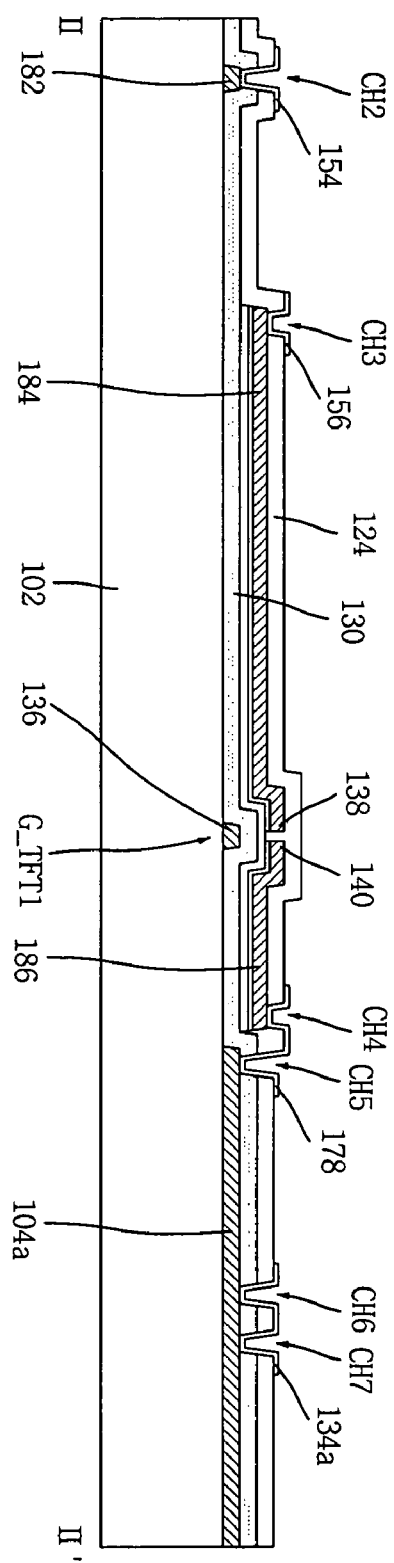
FIG. 6 is a sectional view taken along the line II-II' of FIG. 5.

Referring to FIGS. 5 and 6, the first test pad electrode 154 can be connected to the first test signal line 182 through the second contact hole CH2 that penetrates the gate insulating layer 130 and the protective layer 124.

The second test pad electrode 156 can be connected to the second test signal line 184 through a third contact hole CH3 that penetrates the protective layer 124.

The first jumping unit 178 can electrically connect the third test signal line 186 and the first gate pad unit signal line 104*a* insulated by the gate insulating layer 130 to each other through a fourth contact hole CH4 that penetrates the protective layer 124 and a fifth contact hole CH5 that penetrates the gate insulating layer 130 and the protective layer 124.

The first gate pad electrode 134*a* can be connected to the first gate pad unit signal line 104*a* through sixth and seventh contact holes CH6 and CH7 that penetrate the gate insulating layer 130 and the protective layer 124. Here, the output bump of the driving circuit can be connected onto the first gate pad electrode 134*a*.

In the above-described connection structure, the test driving signal provided from the outside to the first test pad electrode 154 during the lighting test can be provided to the gate electrode 136 of the first gate TFT G_TFT1 along the first test signal line 182. Therefore, the first gate TFT G_TFT1 can be turned on. At this time, the test gate driving signal provided from the outside to the second test pad electrode 156 can be provided to the first gate pad unit signal line 104a sequentially through the second test signal line 184, the source electrode 138 and the drain electrode 140 of the first gate TFT G_TFT1, the third test signal line 186, and the first jumping unit 178. In addition, when the driving circuit is mounted, the gate driving signal output from the output bump of the driving circuit can be provided to the first gate pad unit signal line 104a through the first gate pad electrode 134a.

Figure 7:
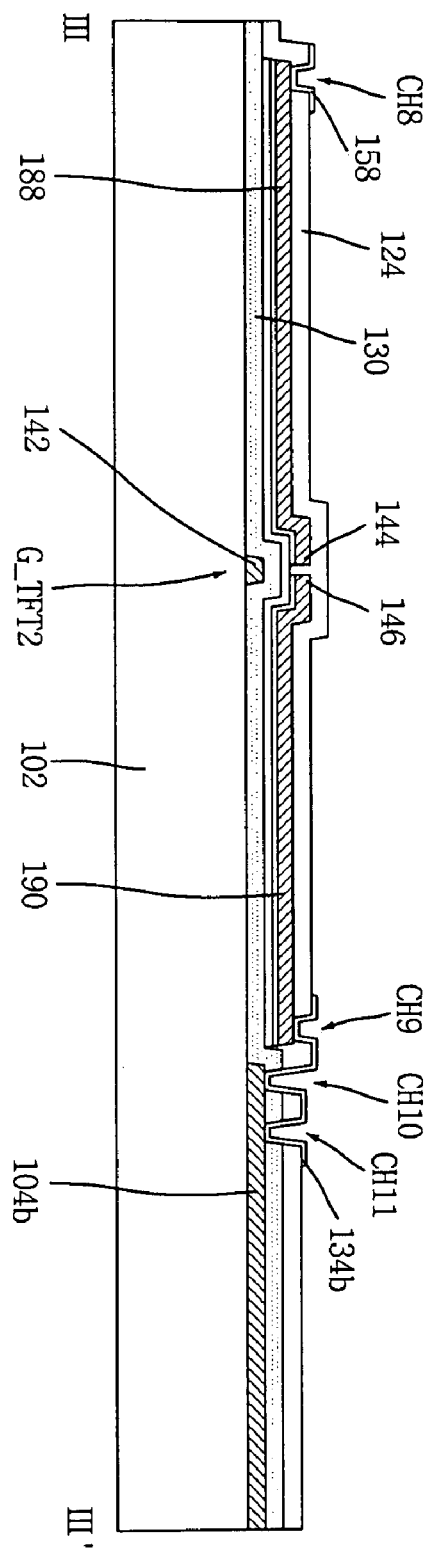
FIG. 7 is a sectional view taken along the line III-III' of FIG. 5.

Referring to FIGS. 5 and 7, the third test pad electrode 158 can be connected to the fourth test signal line 188 through an eighth contact hole CH8 that penetrates the protective layer 124. The first gate jumping pad electrode 134b can electrically connect the fifth test signal line 190 and the second gate pad unit signal line 104b insulated by the gate insulating layer 130 to each other through a ninth contact hole CH9 that penetrates the protective layer 124 and 10th and 11th contact holes CH10 and CH11 that penetrate the gate insulating layer 130 and the protective layer 124. Here, the output bump of the driving circuit 310 can be connected onto the first gate jumping pad electrode 134b.

In the above-described connection structure, the driving signal provided from the outside to the first test pad electrode 154 during the lighting test can be provided to the gate electrode 142 of the second gate TFT G_TFT2 along the first test signal line 182. Therefore, the second gate TFT G_TFT2 can be turned on. At this time, the test gate driving signal provided from the outside to the third test pad electrode 158 can be provided to the second gate pad unit signal line 104b sequentially through the fourth test signal line 188, the source electrode 144 and the drain electrode 146 of the second gate TFT G_TFT2, the fifth test signal line 190, and the first gate jumping pad electrode 134b. In addition, when the driving circuit is mounted, the gate driving signal output from the output bump of the driving circuit can be transmitted to the second gate pad unit signal line 104b through the first gate jumping pad electrode 134b.

As described above, the first gate jumping pad electrode 134b can electrically connect the fifth test signal line 190 and the second gate pad unit signal line 104b insulated from each other and can be connected to the output bump of the driving circuit 310.

Therefore, an additional jumping unit for electrically connecting the fifth test signal line 190 and the second gate pad unit signal line 104b insulated from each other may be omitted. Therefore, the lighting test pattern area TA can be sufficiently secured. As a result, the test patterns can be easily formed although the size of the lighting test pattern area TA is reduced as the size of the driving circuit is reduced.

Figure 8:
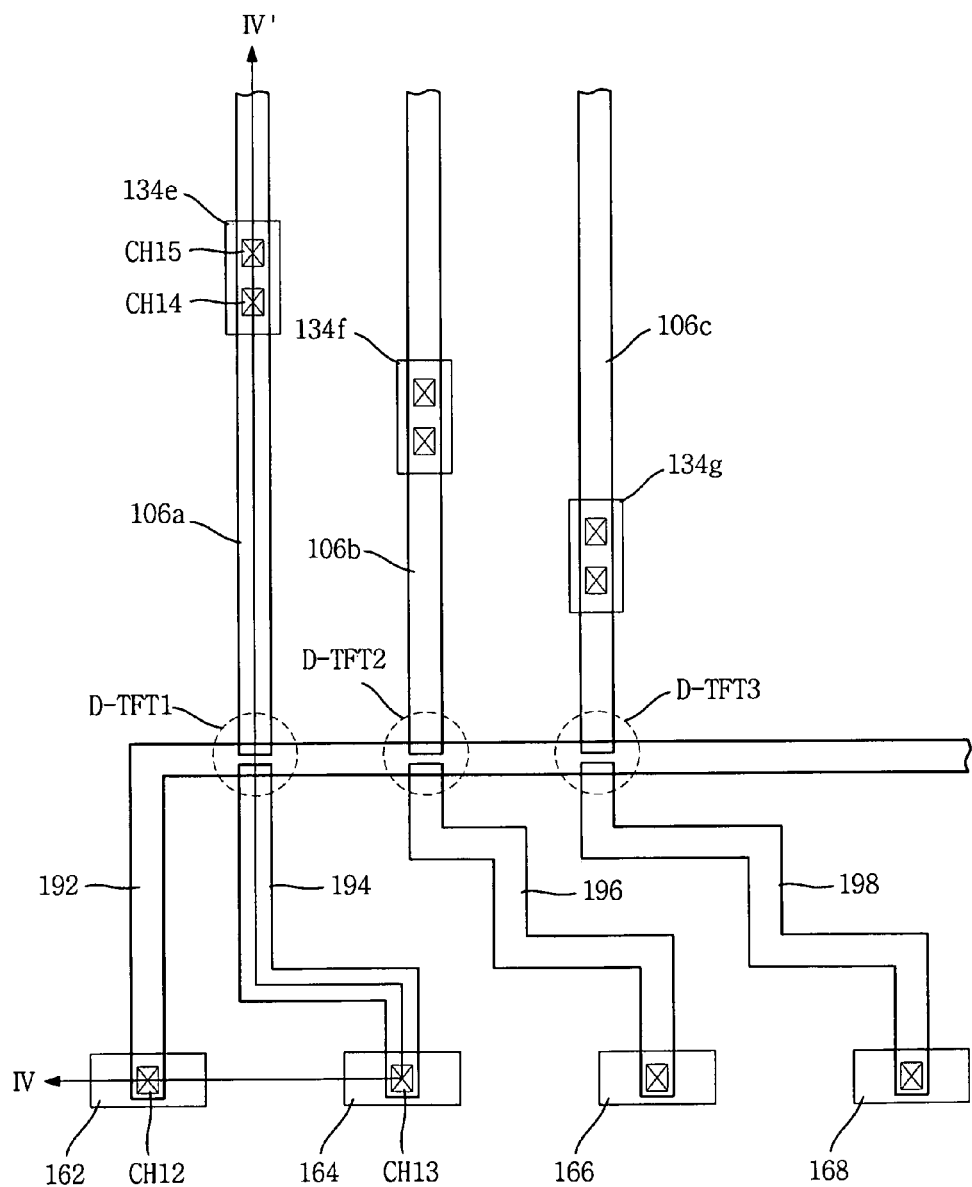
FIG. 8 is a plan view illustrating the connection structures of the data pad unit signal lines of FIG. 4 in detail.

On the other hand, FIG. 8 illustrates the connection structures of the data pad unit signal lines. However, the connection structures are not limited to the above. On the other hand, since the connection structures of the first to third data pad unit signal lines are the same, the connection structure of the first data pad unit signal line will be mainly described.

Referring to FIG. 8, in the data pad unit, as described above, the first to third data TFTs D_TFT1, D_TFT2, and D_TFT3, the fifth to eighth test pad electrodes 162, 164, 166, and 168, the first to third data pad electrodes 134e, 134f, and 134g, and the first to third data pad unit signal lines 106a, 106b, and 106c are formed. In addition, sixth to ninth test signal lines 192, 194, 196, and 198 are further formed in the data pad unit. Here, the fifth to eighth test pad electrodes 162, 164, 166, and 168 and the first to third data pad electrodes 134e, 134f, and 134g can be formed of the transparent conductive metal. In addition, the first to third data pad unit signal lines 106a, 106b, and 106c can be formed of the data metal. In addition, the sixth test signal line 192 can be formed of the gate metal. In addition, the seventh to ninth test signal lines 194, 196, and 198 can be formed of the data metal.

The sixth test signal line 192 can be connected to the gate electrodes of the first to third data TFTs D_TFT1, D_TFT2, and D_TFT3. The seventh test signal line 194 can be connected to the source electrode of the first data TFT D_TFT1. The eighth test signal line 196 can be connected to the source electrode of the second data TFT D_TFT2. The ninth test signal line 198 can be connected to the source electrode of the third data TFT D_TFT3.

Figure 9:
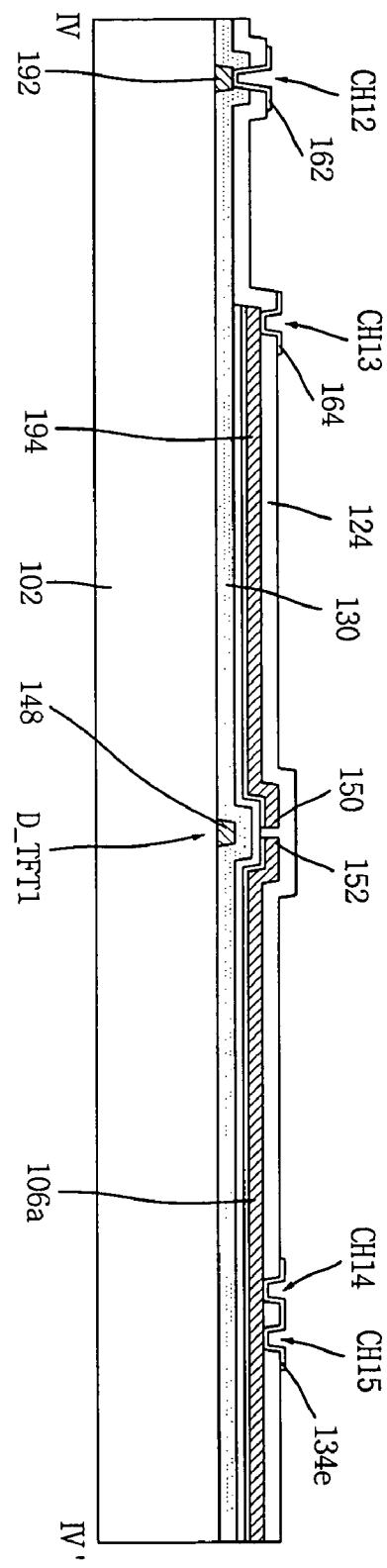
FIG. 9 is a sectional view taken along the line IV-IV' of FIG. 8.

Referring to FIGS. 8 and 9, the fifth test pad electrode 162 can be connected to the sixth test signal line 192 through a 12th contact hole CH12 that penetrates the gate insulating layer 130 and the protective layer 124. The sixth test pad electrode 164 can be connected to the seventh test signal line 194 through a 13th contact hole CH13 that penetrates the protective layer 124.

The first data pad electrode 134e can be connected to the first data pad unit signal line 106a through 14th and 15th contact holes CH14 and CH15 that penetrate the protective layer 124. Here, the output bump of the driving circuit can be connected onto the first data pad electrode 134e.

In the above-described connection structure, the driving signal provided from the outside to the fifth test pad electrode 162 during the lighting test can be provided to the gate electrode 148 of the first data TFT D_TFT1 along the sixth test signal line 192. Therefore, the first data TFT D_TFT1 can be turned on. At this time, the test data driving signal provided from the outside to the sixth test pad electrode 164 can be provided to the first data pad unit signal line 106a sequentially through the seventh test signal line 194 and the source electrode 150 and the drain electrode 152 of the first data TFT D_TFT1. In addition, when the driving circuit is mounted, the data driving signal output from the output bump of the driving circuit can be provided to the first data pad unit signal line 106a through the first data pad electrode 134e.

Figure 10:
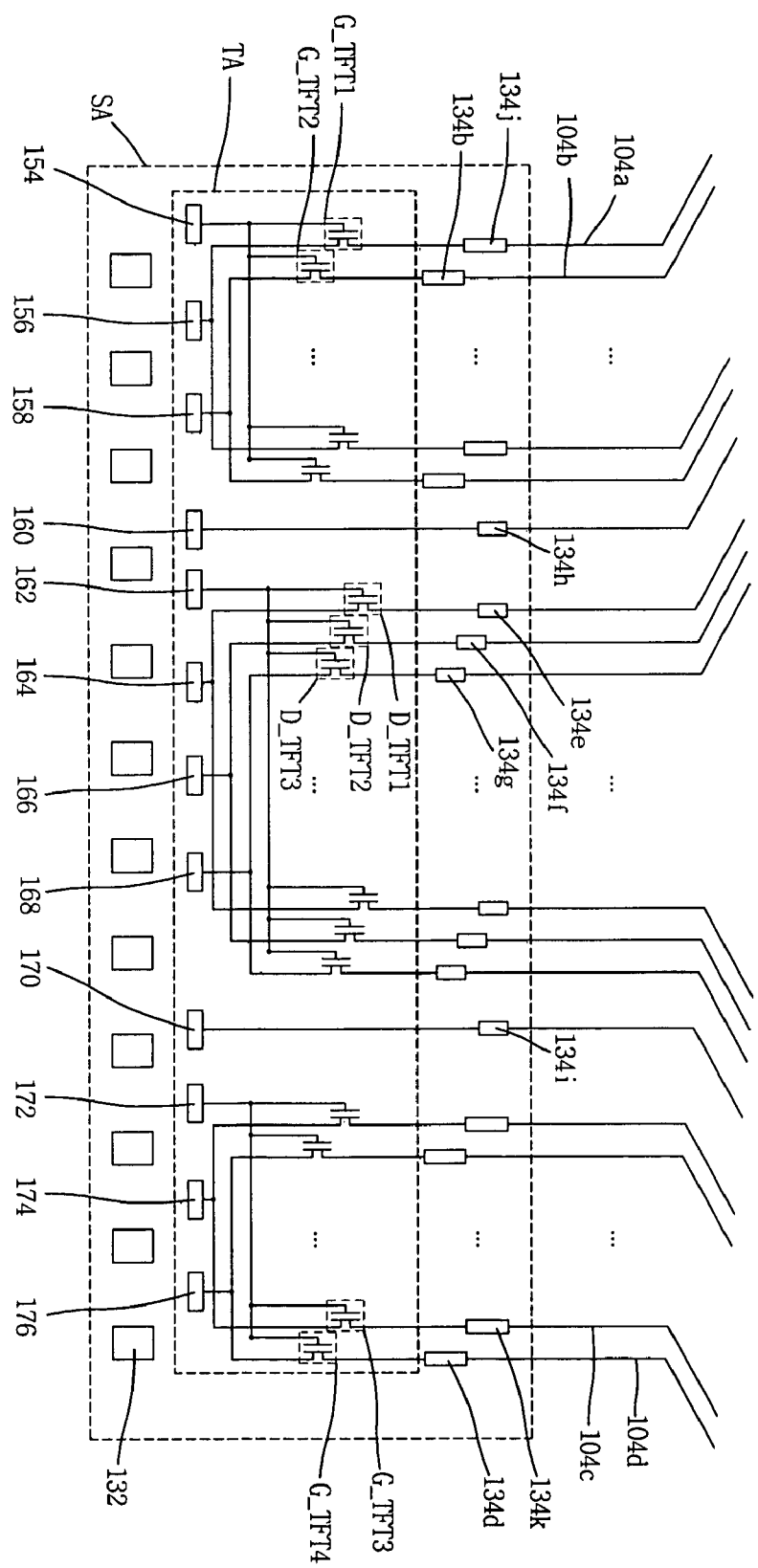
FIG. 10 is a plan view schematically illustrating a second embodiment of the arrangement structure of the driving circuit mounting area of FIG. 1.

On the other hand, since the second embodiment of the arrangement structure of the driving circuit mounting area illustrated in FIG. 10 is the same as the first embodiment of the arrangement structure of the driving circuit mounting area illustrated in FIG. 4 excluding that all of the gate pad unit signal lines are connected to the test signal lines by the gate jumping pad electrodes, the same reference numerals as the reference numerals of FIG. 4 are used, redundant description is omitted, and only the characteristics will be described.

Referring to FIG. 10, the input bump and the output bump of the driving circuit mounted in the driving circuit mounting area SA on the insulating substrate 102 can be connected to the input pad electrode 132 and the output pad electrode 134, respectively.

The output pad electrode 134 can include first to fourth gate jumping pad electrodes 134b, 134d, 134j, and 134k, the first to third data pad electrodes 134e, 134f, and 134g, and the first and second common pad electrodes 134h and 134i. Here, the third gate jumping pad electrode 134j can be connected to the first gate pad unit signal line 104a. The fourth gate jumping pad electrode 134k can be connected to the third gate pad unit signal line 104c.

In the lighting test pattern area TA provided in the driving circuit mounting area SA, the gate TFT G_TFT, data TFT D_TFT, and the first to 12th test pad electrodes 154, 156, 158, 160, 162, 164, 166, 168, 170, 172, 174, and 176 can be formed.

The gate TFT G_TFT can include the first to fourth gate TFTs G_TFT1, G_TFT2, G_TFT3, and G_TFT4. The gate electrode of the first gate TFT G_TFT1 can be connected to the first test pad electrode 154. The source electrode of the first gate TFT G_TFT1 can be connected to the second test pad electrode 156. The drain electrode of the first gate TFT G_TFT1 can be connected to the third gate jumping pad electrode 134j. The gate electrode of the third gate TFT G_TFT3 can be connected to the 10th test pad electrode 172. The source electrode of the third gate TFT G_TFT3 can be connected to the 11th test pad electrode 174. The drain electrode of the third gate TFT G_TFT3 can be connected to the fourth gate jumping pad electrode 134k.

Figure 11:
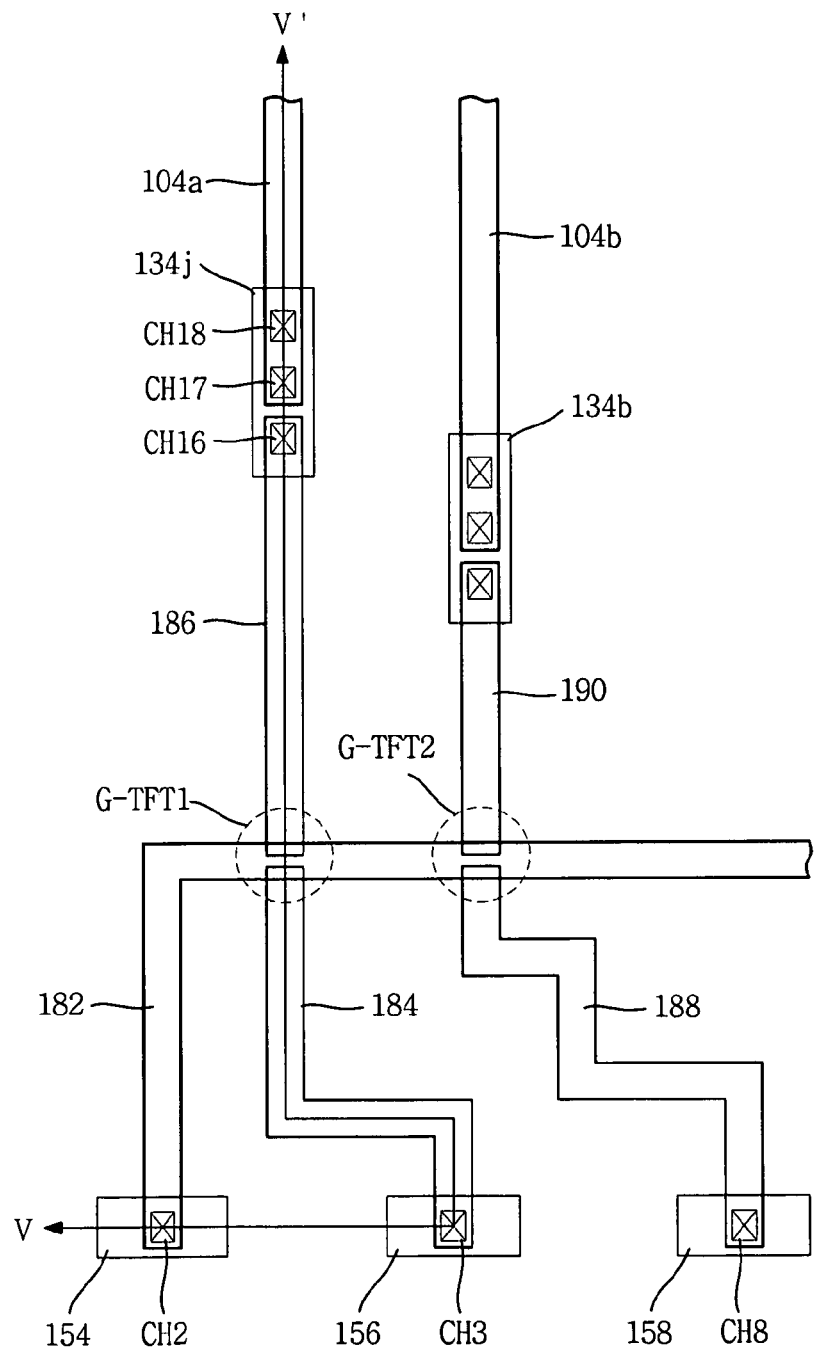
FIG. 11 is a plan view illustrating the connection structures of the gate pad unit signal lines of FIG. 10 in detail.

On the other hand, FIG. 11 illustrates the connection structures of the first and second gate pad unit signal lines formed on the left of the lower end of the non-display area among the gate pad unit signal lines. However, the connection structures are not limited to the above. On the other hand, since the connection structures of the third and fourth gate pad unit signal lines formed on the right of the lower end of the non-display area among the gate pad unit signal lines are the same as the connection structures of the first and second gate pad unit signal lines illustrated in FIG. 11, detailed description thereof will be omitted. In addition, since the connection structure of the second gate pad unit signal line illustrated in FIG. 11 is the same as the connection structure of the second gate pad unit signal line illustrated in FIG. 5, the same reference numeral is used, redundant description is omitted, and only the characteristics will be omitted.

Referring to FIG. 11, in the gate pad unit on the left of the lower end of the non-display area NDA, as described above, the first and second gate TFTs G_TFT1 and G_TFT2, the first to third test pad electrodes 154, 156, and 158, the first and third gate jumping pad electrodes 134b and 134j, and the first and second gate pad unit signal lines 104a and 104b are formed. In addition, in the gate pad unit on the left of the lower end of the non-display area NDA, the first to fifth test signal lines 182, 184, 186, 188, and 190 are further formed. Here, the first to third test pad electrodes 154, 156, and 158 and the first and third gate jumping pad electrodes 134b and 134j can be formed of the transparent conductive metal. In addition, the first and second gate pad unit signal lines 104a and 104b can be formed of the gate metal. In addition, the first test signal line 182 can be formed of the gate metal. In addition, the second to fifth test signal lines 184, 186, 188, and 190 can be formed of the data metal.

Figure 12:
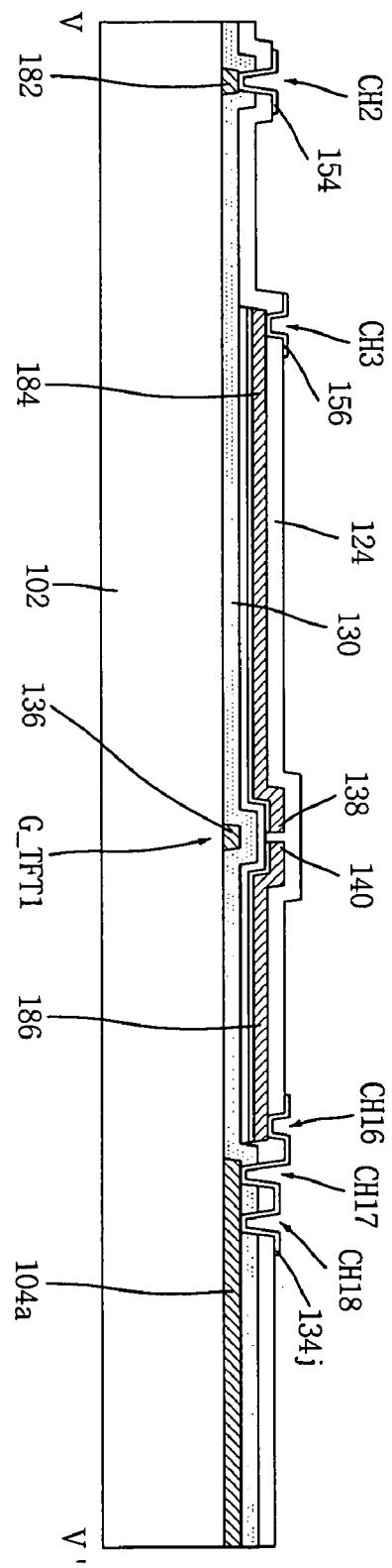
FIG. 12 is a sectional view taken along the line V-V' of FIG. 11.

Referring to FIGS. 11 and 12, the third gate jumping pad electrode 134j can electrically connect the third test signal line 186 and the first gate pad unit signal line 104a insulated by the gate insulating layer 130 to each other through a 16th contact hole CH16 that penetrates the protective layer 124 and 17th and 18th contact holes CH17 and CH18 that penetrate the gate insulating layer 130 and the protective layer 124. Here, the output bump of the driving circuit can be connected onto the third gate jumping pad electrode 134j.

In the above-described connection structure, the driving signal provided from the outside to the first test pad electrode 154 during the lighting test can be provided to the gate electrode 136 of the first gate TFT G_TFT1 along the first test signal line 182. Therefore, the first gate TFT G_TFT1 can be turned on. At this time, the test gate driving signal provided from the outside to the second test pad electrode 156 can be provided to the first gate pad unit signal line 104a sequentially through the second test signal line 184, the source electrode 138 and the drain electrode 140 of the first gate TFT G_TFT1, the third test signal line 186, and the third gate jumping pad electrode 134j. In addition, when the driving circuit is mounted, the driving signal output from the output bump of the driving circuit can be provided to the first gate pad unit signal line 104a through the third gate jumping pad electrode 134j.

As described above, the third gate jumping pad electrode 134j can connect the third test signal line 186 and the first gate pad unit signal line 104a insulated from each other and can be connected to the output bump of the driving circuit. Therefore, an additional jumping unit for electrically connecting the third test signal line 186 and the first gate pad unit signal line 104a insulated from each other may not be formed. Therefore, the lighting test pattern area TA can be further secured. As a result, the test patterns can be easily formed although the size of the lighting test pattern area TA is reduced as the size of the driving circuit is reduced. In addition, as illustrated in FIGS. 5 and 7, the first gate jumping pad electrode 134b can connect the fifth test signal line 190 and the second gate pad unit signal line 104b insulated from each other and can be connected to the output bump of the driving circuit. Therefore, an additional jumping unit for electrically connecting the fifth test signal line 190 and the second gate pad unit signal line 104b insulated from each other may not be formed. Therefore, the lighting test pattern area TA can be further secured.

Figure 13:
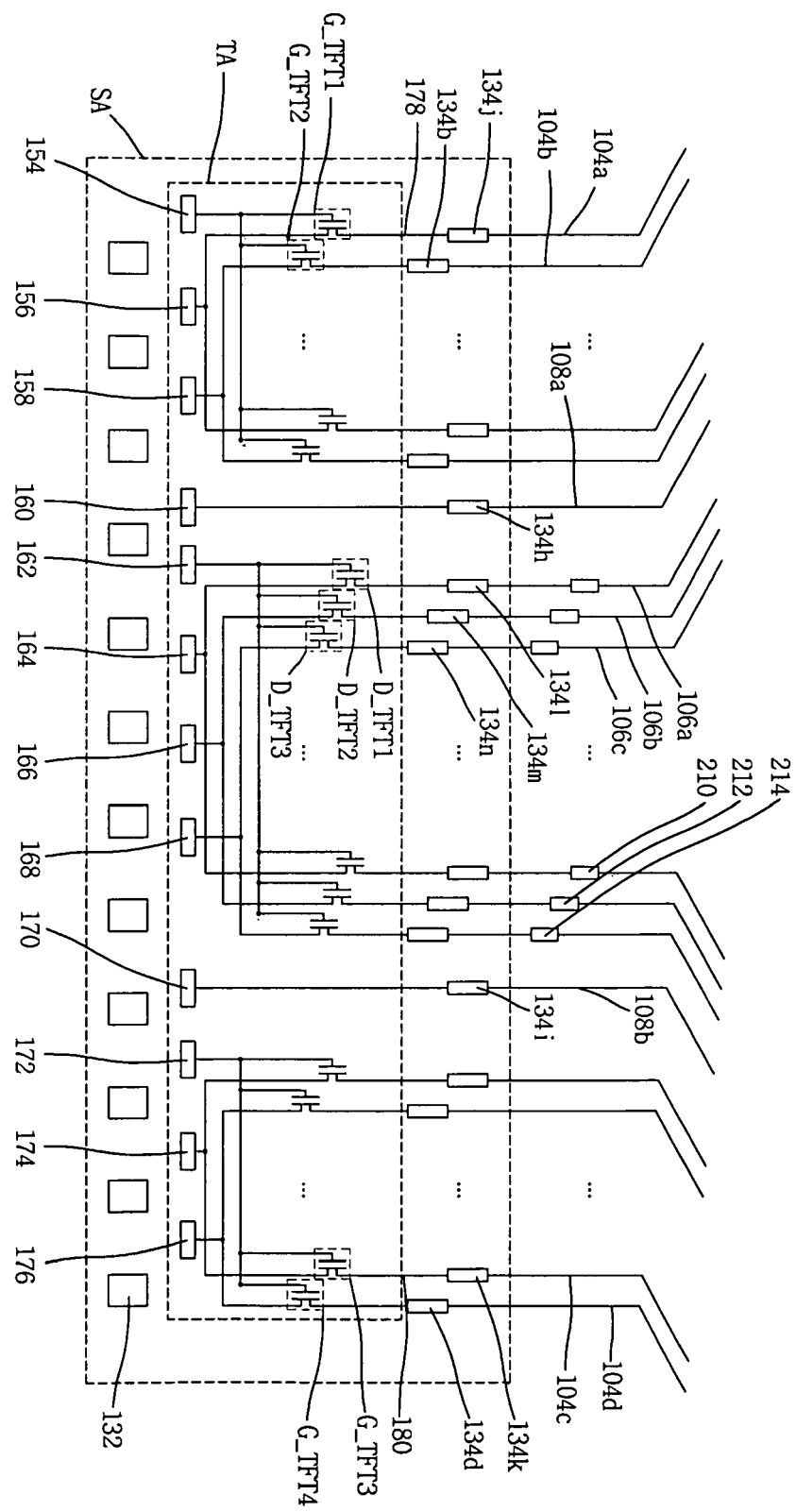
FIG. 13 is a plan view schematically illustrating a third embodiment of the arrangement structure of the driving circuit mounting area of FIG. 1.

On the other hand, since the third embodiment of the arrangement structure of the driving circuit mounting area illustrated in FIG. 13 is the same as the second embodiment of the arrangement structure of the driving circuit mounting area illustrated in FIG. 10 excluding that all of the gate pad unit signal lines and all of the data pad unit signal lines are electrically connected to the test signal lines by the jumping pad electrodes, the same reference numerals as the reference numerals of FIG. 10 are used, redundant description is omitted, and only the characteristics will be described.

Referring to FIG. 13, the input bump and the output bump of the driving circuit mounted in the driving circuit mounting area SA on the insulating substrate 102 can be connected to the input pad electrode 132 and the output pad electrode 134, respectively.

The output pad electrode 134 can include first to fourth gate jumping pad electrodes 134b, 134d, 134j, and 134k, first to third data jumping pad electrodes 134l, 134m, and 134n, and the first and second common pad electrodes 134h and 134i. In the lighting test pattern area TA provided in the driving circuit mounting area SA, the gate TFT G_TFT, data TFT D_TFT, and the first to 12th test pad electrodes 154, 156, 158, 160, 162, 164, 166, 168, 170, 172, 174, and 176 can be formed.

The data TFT D_TFT can include the first to third data TFTs D_TFT1, D_TFT2, and D_TFT3. The gate electrode of the first data TFT D_TFT1 can be connected to the fifth test pad electrode 162. The source electrode of the first data TFT D_TFT1 can be connected to the sixth test pad electrode 164. The drain electrode of the first data TFT D_TFT1 can be connected to the first data jumping pad electrode 134l.

Here, the first data jumping pad electrode 134l can be connected to the third jumping unit 210. Here, the third jumping unit 210 can be formed outside the driving circuit mounting area.

The gate electrode of the second data TFT D_TFT2 can be connected to the fifth test pad electrode 162. The source electrode of the second data TFT D_TFT2 can be connected to the seventh test pad electrode 166. The drain electrode of the second data TFT D_TFT2 can be connected to the second data jumping pad electrode 134m. Here, the second data jumping pad electrode 134 can be connected to the fourth jumping unit 212. Here, the fourth jumping unit 212 can be formed outside the driving circuit mounting area.

The gate electrode of the third data TFT D_TFT3 can be connected to the fifth test pad electrode 162. The source electrode of the third data TFT D_TFT3 can be connected to the eighth test pad electrode 168. The drain electrode of the third data TFT D_TFT3 can be connected to the third data jumping pad electrode 134n. Here, the third data jumping pad electrode 134n can be connected to the fifth jumping unit 214. Here, the fifth jumping unit 214 can be formed outside the driving circuit mounting area.

Figure 14:
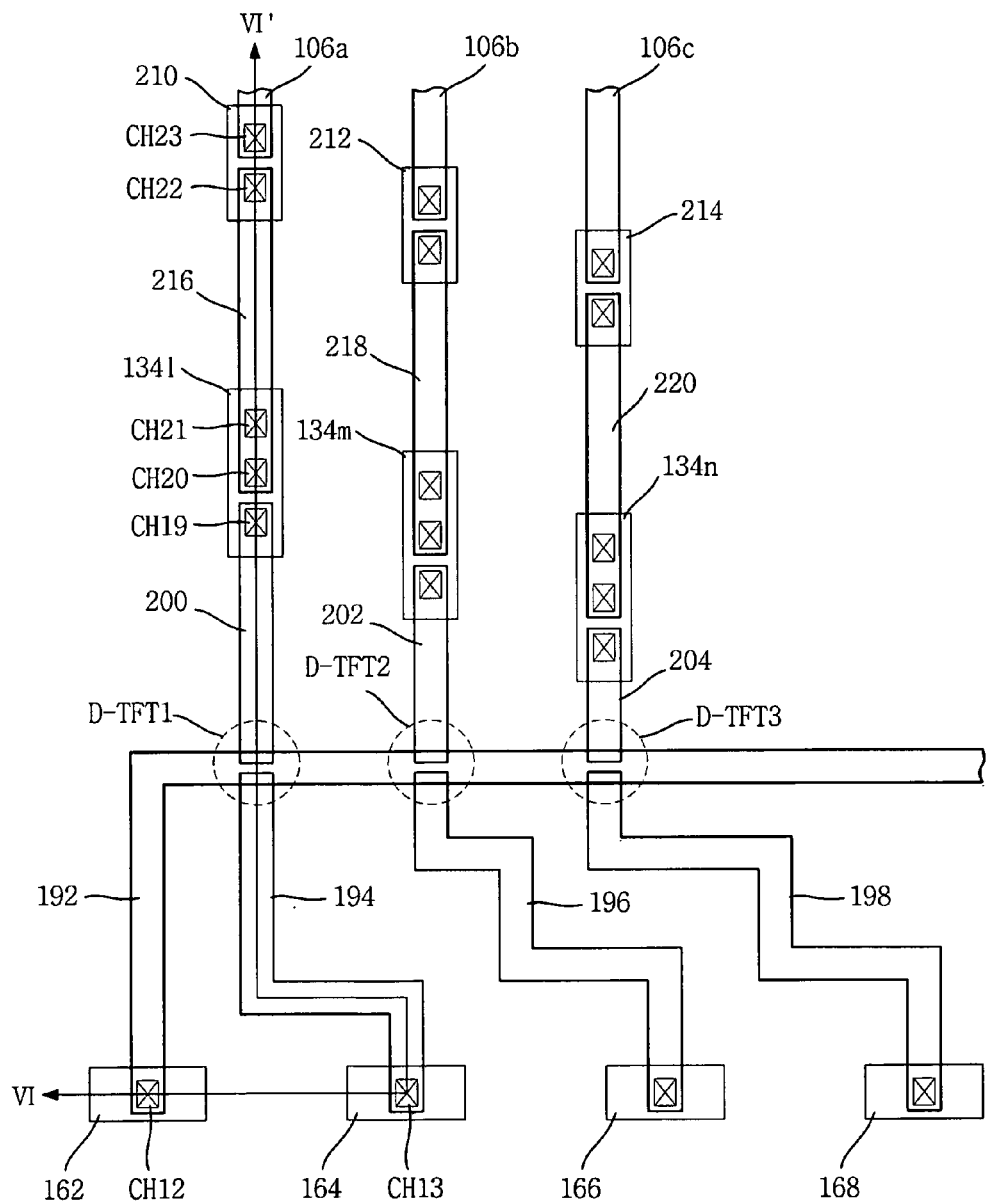
FIG. 14 is a plan view illustrating the connection structures of the data pad unit signal lines of FIG. 13 in detail.

On the other hand, FIG. 14 illustrates the connection structures of the data pad unit signal lines. However, the connection structures are not limited to the above. On the other hand, since the connection structures of the first to third data pad unit signal lines are the same, the connection structure of the first data pad unit signal line will be mainly described.

Referring to FIG. 14, in the data pad unit, the first to third data TFTs D_TFT1, D_TFT2, and D_TFT3, the fifth to eighth test pad electrodes 162, 164, 166, and 168, the first to third data jumping pad electrodes 134l, 134m, and 134n, the third to fifth jumping units 210, 212, and 214, and the first to third data pad unit signal lines 106a, 106b, and 106c are formed. In addition, in the data pad unit, sixth to 12th test signal lines 192, 194, 196, 198, 200, 202, and 204 and first to third auxiliary data pad unit signal lines 216, 218, and 220 are further formed. Here, the fifth to eighth test pad electrodes 162, 164, 166, and 168, the first to third data jumping pad electrodes 134l, 134m, and 134n, and the third to fifth jumping units 210, 212, and 214 can be formed of the transparent conductive metal. In addition, the first to third data pad unit signal lines 106a, 106b, and 106c can be formed of the data metal. In addition, the sixth test signal line 192 can be formed of the gate metal. In addition, the seventh to 12th test signal lines 194, 196, 198, 200, 202, and 204 can be formed of the data metal. In addition, the first to third auxiliary data pad unit signal lines 216, 218, and 220 can be formed of the gate metal.

Figure 15:
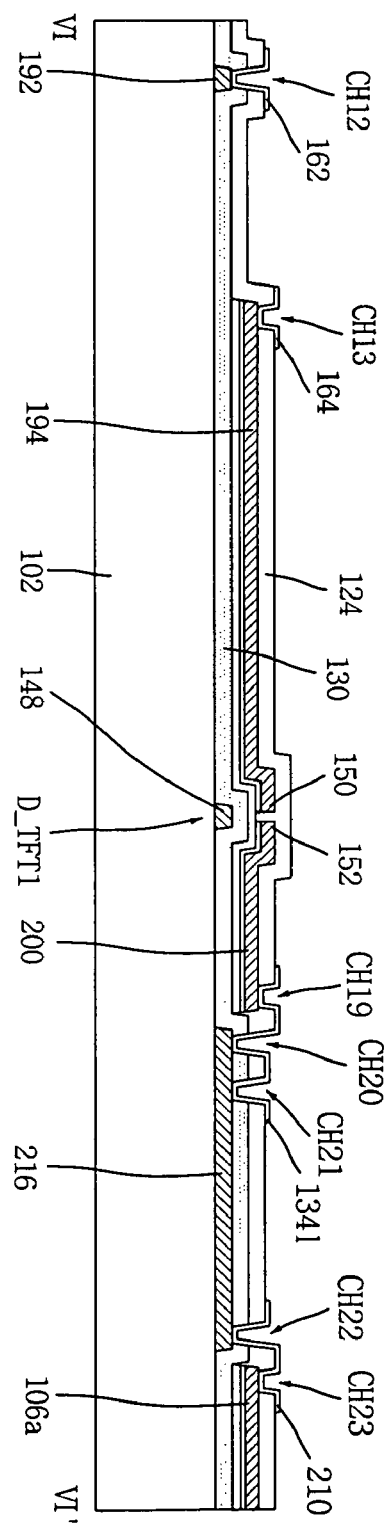
FIG. 15 is a sectional view taken along the line VI-VI' of FIG. 14.

Referring to FIGS. 14 and 15, the first data jumping pad electrode 134l can electrically connect the 10th test signal line 200 and the first auxiliary data pad unit signal line 216 insulated from each other through a 19th contact hole CH19 that penetrates the protective layer 124 and 20th and 21st contact holes CH20 and CH21 that penetrate the gate insulating layer 130 and the protective layer 124. Here, the output bump of the driving circuit can be connected onto the first data jumping pad electrode 134l.

The third jumping unit 210 can be connected to the first auxiliary data pad unit signal line 216 through a 22nd contact hole CH22 that penetrates the gate insulating layer 130 and the protective layer 124 and can be connected to the first data pad unit signal line 106a through a 23rd contact hole CH23 that penetrates the protective layer 124.

In the above-described connection structure, the driving signal provided from the outside to the fifth test pad electrode 162 during the lighting test can be provided to the gate electrode 148 of the first data TFT D_TFT1 along the sixth test signal line 192. Therefore, the first data TFT D_TFT1 can be turned on. At this time, the test data driving signal provided from the outside to the sixth test pad electrode 164 can be provided to the first data pad unit signal line 106a sequentially through the seventh test signal line 194, the source electrode 150 and the drain electrode 152 of the first data TFT D_TFT1, the 10th test signal line 200, the first data jumping pad electrode 134l, the first auxiliary data pad unit signal line 216, and the third jumping unit 210. In addition, when the driving circuit is mounted, the data driving signal output from the output bump of the driving circuit can be provided to the first data pad unit signal line 106a sequentially through the first data jumping pad electrode 134l, the first auxiliary data pad unit signal line 216, and the third jumping unit 210.

As described above, when the first data jumping pad electrode 134l is formed, since an additional jumping unit may not be additionally formed in the driving circuit mounting area, the lighting test pattern area TA can be further secured. As a result, the test patterns can be easily formed although the size of the lighting test pattern area TA is reduced as the size of the driving circuit is reduced. In addition, in this case, it is possible to effectively prevent the first data pad unit signal line 106a from being pressed during a thermo-compression process for mounting the driving circuit due to the first auxiliary data pad unit signal line 216 formed of the gate metal.

Figure 16:
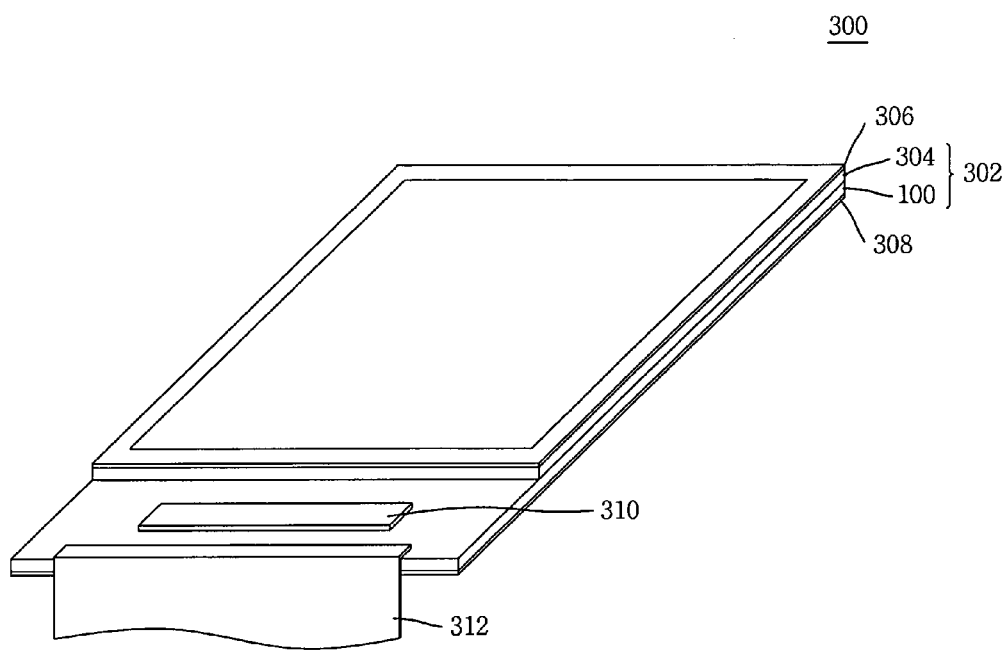
FIG. 16 is a perspective view schematically illustrating a liquid crystal display (LCD) comprising the TFT substrate illustrated in FIG. 1.

On the other hand, FIG. 16 illustrates a liquid crystal display (LCD) as a flat panel display (FPD), which is for describing the FPD including the TFT substrate according to an embodiment of the present invention. However, the present invention is not limited to the above. Therefore, the TFT substrate according to an embodiment of the present invention can be provided in another kind of FPD such as an organic light emitting diode (OLED) as well as in the LCD.

Referring to FIG. 16, an LCD 300 can display an image using the electro-optic characteristic of a liquid crystal layer. Therefore, the LCD 300 can include a liquid crystal panel 302 and a driving circuit 310.

The liquid crystal panel 302 is a kind of an FPD panel that displays an image through the display area DA and can include a color filter substrate 304 and a TFT substrate 100 that face each other with the liquid crystal layer interposed.

The color filter substrate 304 can realize the color of a displayed image through the liquid crystal panel 302. Here, a first polarizer 306 can be attached to the external surface of the color filter substrate 304.

The TFT substrate 100 can apply driving signals output from the driving circuit 310 to the liquid crystal layer. Here, a second polarizer 308 can be attached to the external surface of the TFT substrate 100.

The driving circuit 310 can receive the driving signals from the outside through a flexible printed circuit (FPC) 312 connected to the external connection signal line 114 and can provide the driving signals to the TFT substrate 100 to drive the LCD 300. Therefore, the driving circuit 310 can be mounted in the driving circuit mounting area SA provided in the non-display area NDA of the TFT substrate 100. Here, the driving circuit 310 can be mounted on the driving circuit mounting area SA by a chip on glass (COG) method.

Figure 17:
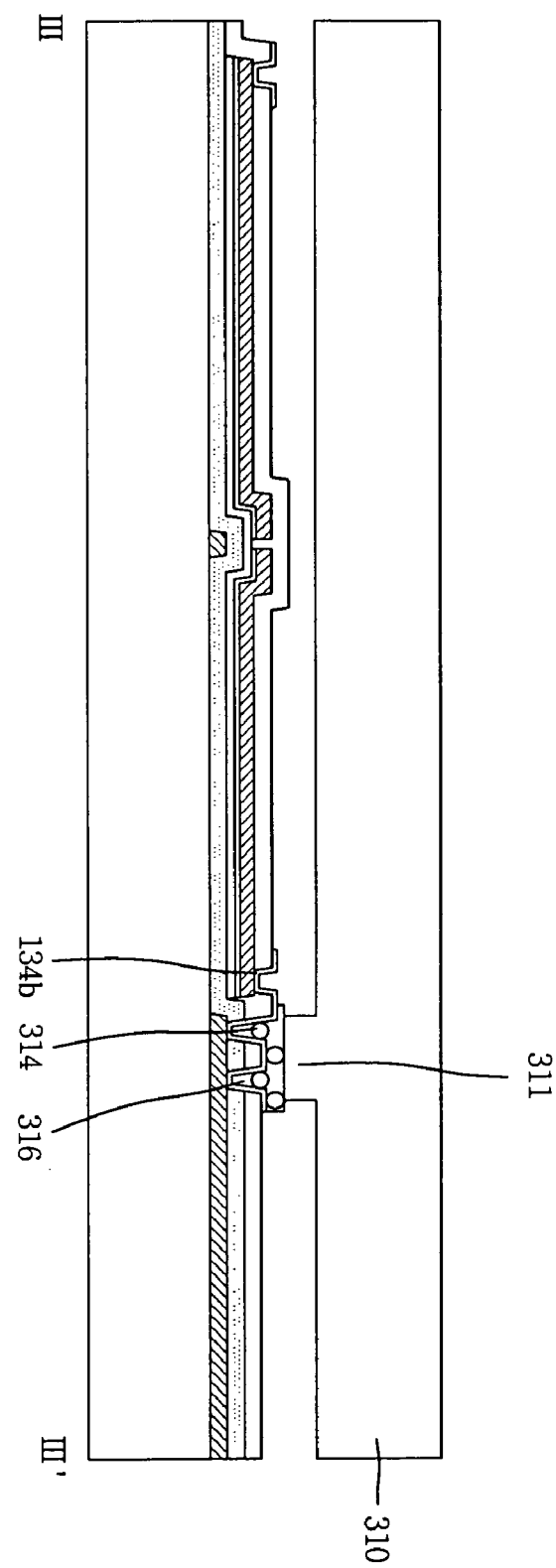
FIG. 17 is a sectional view illustrating the connection structure of the output bump of the driving circuit of FIG. 16.

On the other hand, since the connection structure of the input bump of the driving circuit of FIG. 17 is similar to the connection structure of the input bump of the driving circuit of FIG. 17, detailed description thereof will be omitted.

In detail, the output bump 311 of the driving circuit 310 can be connected to, for example, the first gate jumping pad electrode 134b through the thermo-compression process using an anisotropic conductive film (ACF) 316 including a conductive ball 314.

While embodiments of the present invention are described with reference to the accompanying drawings. However, it will be understood by those skilled in the art that various changes in form and details may be made therein without departing from the spirit and scope of the invention.

Since the above-described embodiments are provided to completely inform those skilled in the art of the scope of the present invention, it will be understood that the embodiments are exemplary and are not limited. The present invention is defined by the scope of the claims.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A thin film transistor (TFT) substrate, comprising:
a display area and a non-display area, the display area including a plurality of signal lines;
a TFT formed in the non-display area and comprising a gate electrode, a source electrode, and a drain electrode, wherein the TFT provides test driving signals provided from an outside to the display area during a test;
a test signal line connected to the drain electrode of the TFT;
a pad unit signal line insulated from the test signal line by an insulating layer and connected to one of the signal lines formed in the display area; and
a jumping pad electrode that connects the test signal line and the pad unit signal line to each other through a contact hole that penetrates the insulating layer, and that is mounted to an output bump of a driving circuit, wherein the driving circuit provides driving signals to the pad unit signal line.

2. The TFT substrate of claim 1, further comprising:
a first test pad electrode connected to the gate electrode of the TFT; and
a second test pad electrode connected to the source electrode of the TFT.

3. The TFT substrate of claim 1, wherein a driving circuit mounting area for mounting the driving circuit connected to the jumping pad electrode is provided in the non-display area, and;
wherein the TFT, the test signal line, and the jumping pad electrode are formed in the driving circuit mounting area.

4. The TFT substrate of claim 1, wherein the test signal line is formed on the same plane as the drain electrode of the TFT of the same material.

5. The TFT substrate of claim 1, wherein the pad unit signal line is formed on the same plane as the gate electrode of the TFT of the same material.

6. The TFT substrate of claim 1, wherein a signal line formed in the display area and connected to the pad unit signal line is one of a gate line and a data line that are insulated from each other and that cross each other.

7. The TFT substrate of claim 1, wherein the driving circuit connected to the jumping pad electrode is mounted on the insulating substrate by a chip on glass (COG) method.

8. A TFT substrate, comprising:
a gate line and a data line that are insulated from each other and that cross each other in a display area on an insulating substrate, wherein the TFT substrate is divided into the display area and a non-display area;
a pad unit signal line connected to one of the gate line and the data line;
a first TFT that provides a test driving signal provided from an outside to the display area during a test;
a test signal line insulated from the pad unit signal line by an insulating layer and connected to the first TFT;
a jumping pad electrode that connects the pad unit signal line and the test signal line to each other through a first contact hole that penetrates the insulating layer, and that is mounted to an output bump of a driving circuit, wherein the driving circuit provides driving signals to the pad unit signal line.

9. The TFT substrate of claim 8, further comprising:
a second TFT formed in an crossing between the gate line and the data line; and
a pixel electrode connected to the second TFT through a second contact hole that penetrates the insulating layer.

10. The TFT substrate of claim 8, wherein a driving circuit mounting area for mounting the driving circuit connected to the jumping pad electrode is provided in the non-display area; and
wherein the first TFT, the test signal line, and the jumping pad electrode are formed in the driving circuit mounting area.

11. The TFT substrate of claim 8, wherein the pad unit signal line is a gate pad unit signal line connected to the gate line; and
wherein the gate pad unit signal line comprises first and second gate pad unit signal lines formed on left and right of one end of the insulating substrate.

12. The TFT substrate of claim 11 wherein the first gate pad unit signal line is connected to odd gate lines among the gate lines; and
wherein the second gate pad unit signal line is connected to even gate lines among the gate lines.

13. The TFT substrate of claim 8 wherein the pad unit signal line is a data pad unit signal line connected to the data line; and
wherein the data pad unit signal line is connected to the data line by a jumping unit.

14. The TFT substrate of claim 13 wherein the jumping unit electrically connects the data pad unit signal line and the data line to each other through a third contact hole that penetrates the insulating layer.

15. A flat panel display (FPD), comprising:
a FPD panel comprising a TFT substrate divided into a display area and a non-display area to display an image through the display area; and
a driving circuit mounted on the TFT substrate of the FPD panel to provide driving signals for driving the FPD panel to the TFT substrate,
wherein the TFT substrate of the FPD panel comprises:
a TFT comprising a gate electrode, a source electrode, and a drain electrode formed on an insulating substrate to provide test driving signals provided from the outside to the display area;
a test signal line connected to the drain electrode of the TFT;
a pad unit signal line insulated from the test signal line by an insulating layer and connected to signal lines formed in the display area; and
a jumping pad electrode electrically connecting the test signal line and the pad unit signal line to each other through a contact hole that penetrates the insulating layer, connected to a driving circuit, and providing driving signals provided from the driving circuit to the pad unit signal line.

16. The FPD of claim 15, wherein the TFT substrate further comprises:
a first test pad electrode connected to the gate electrode of the TFT; and
a second test pad electrode connected to the source electrode of the TFT.

17. The FPD of claim 15, wherein a driving circuit mounting area for mounting the driving circuit is provided in the non-display area of the TFT substrate, and wherein the TFT, the test signal line, and the jumping pad electrode of the TFT substrate are formed in the driving circuit mounting area.

18. The FPD of claim 15, wherein the test signal line of the TFT substrate is formed on the same plane of the drain electrode of the TFT of the TFT substrate of the same material.

19. The FPD of claim 15, wherein the pad unit signal line of the TFT substrate is formed on the same plane of the gate electrode of the TFT of the TFT substrate of the same material.

20. The FPD of claim 15, wherein a signal line formed in the display area connected to the pad unit signal line of the TFT substrate is one of a gate line and a data line that are insulated from each other and that cross each other.

* * * * *